(12) United States Patent
Hwang

(10) Patent No.: US 8,072,077 B2
(45) Date of Patent: Dec. 6, 2011

(54) SEMICONDUCTOR MEMORY DEVICE

(75) Inventor: Sang Min Hwang, Seoul (KR)

(73) Assignee: Hynix Semiconductor Inc., Icheon-si (KR)

( * ) Notice: Subject to any disclaimer, the term of this patent is extended or adjusted under 35 U.S.C. 154(b) by 258 days.

(21) Appl. No.: 12/344,708

(22) Filed: Dec. 29, 2008

(65) Prior Publication Data

US 2010/0109162 A1    May 6, 2010

(30) Foreign Application Priority Data

Oct. 30, 2008    (KR) .................. 10-2008-0107139

(51) Int. Cl.
*H01L 23/48* (2006.01)
*H01L 21/768* (2006.01)

(52) U.S. Cl. ......... 257/773; 257/E21.645; 257/E21.703; 257/E27.081; 257/E27.084; 257/E27.112; 257/E21.575; 257/E23.01; 257/E27.009; 257/314; 257/301; 257/298; 257/499

(58) Field of Classification Search ............... 257/314, 257/E21.645, E21.703, E27.081, E27.084, 257/E27.112, 773, E21.575, E23.01, 301, 257/298, 499, E27.009
See application file for complete search history.

(56) References Cited

U.S. PATENT DOCUMENTS

| | | | |
|---|---|---|---|
| 6,420,743 B1 * | 7/2002 | Hirano et al. .................. | 257/295 |
| 7,075,820 B2 | 7/2006 | Yamada et al. | |
| 7,388,769 B2 * | 6/2008 | Miki ................................ | 365/65 |
| 2005/0018471 A1 * | 1/2005 | Arimoto et al. ................ | 365/149 |
| 2006/0057814 A1 * | 3/2006 | Weis .............................. | 438/386 |
| 2006/0076601 A1 * | 4/2006 | Hon et al. ....................... | 257/301 |
| 2007/0158723 A1 * | 7/2007 | Yokoi ............................. | 257/298 |
| 2008/0237776 A1 * | 10/2008 | Abbott ............................ | 257/499 |
| 2010/0067284 A1 * | 3/2010 | Fukuda et al. ................. | 365/149 |

FOREIGN PATENT DOCUMENTS

| | | |
|---|---|---|
| JP | 2005-191451 A | 7/2005 |
| KR | 10-2008-0072385 | 8/2008 |
| KR | 10-2009-0071068 | 7/2009 |

* cited by examiner

*Primary Examiner* — A O Williams

(74) *Attorney, Agent, or Firm* — Marshall, Gerstein & Borun LLP

(57) ABSTRACT

Disclosed herein is a semiconductor memory device for reducing a junction resistance and increasing amount of current throughout the unit cell. A semiconductor memory device comprises plural unit cells, each coupled to contacts formed in different shape at both sides of a word line in a cell array.

9 Claims, 12 Drawing Sheets

SEMICONDUCTOR MEMORY DEVICE

CROSS-REFERENCE TO RELATED APPLICATION

Priority is claimed to Korean patent application number 10-2008-0107139, filed on Oct. 30, 2008, which are incorporated by reference in its entirety.

BACKGROUND OF THE INVENTION

The invention relates generally to a method for fabricating a semiconductor device and, more specifically, to a technology of forming a floating body transistor used in a highly-integrated semiconductor device using a silicon-on-insulator (SOI) structure.

In many semiconductor device systems, a semiconductor memory device is configured to store data generated or processed in the device. For example, if a request from a data processor such as a central processing unit (CPU) is received, a semiconductor memory device may output data to the data processor from unit cells in the device, or the device may store data processed by the data processor to unit cells of an address transmitted with the request.

Although data storage capacity of semiconductor memory device has increased, the size of semiconductor memory device has not increased proportionally because various elements and components used for read or write operations in a semiconductor memory device have reduced in size. Accordingly, components and elements unnecessarily duplicated in the semiconductor memory device, such as transistors or wires, are combined or merged to decrease the area occupied by each component. Particularly, the reduction of the size of unit cells included in the semiconductor memory device affects improvement of the degree of integration.

As an example of a semiconductor memory device, Dynamic Random Access Memory (DRAM) is a type of volatile memory device configured to retain data while a power source is supplied. The unit cell comprises a transistor and a capacitor. In the case of the unit cell having a capacitor, after the datum "1" is delivered to the capacitor, charges that are temporarily stored in the storage node are dissipated, i.e., the amount of the charge stored therein is reduced, because of both leakage currents generated at junction of the storage nodes and inherent characteristics of the capacitor. As a result, a refresh operation is periodically required on the unit cells so that data stored in the DRAM cannot be destroyed.

In order to prevent the reduction of charge, numerous methods for increasing capacitance (Cs) of the capacitor included in the unit cell have been suggested so that more charges may be stored in the storage node. Otherwise, a capacitor having a two-dimensional structure is changed to have a three-dimensional cylindrical structure or a trench structure, thereby increasing the surface area of both electrodes of the capacitor. However, as the design rule is reduced, the plane area where a capacitor can be formed is reduced, and it is difficult to develop materials constituting an insulating film in the capacitor. As a result, the junction resistance value of the storage node (SN) and the turn-on resistance value of the transistor in the unit cell are larger, and accordingly it is difficult to perform normal read and write operations, and refresh characteristics deteriorate.

To improve the above-described shortcomings, the unit cell may comprise a transistor having a floating body. Thus, the unit cell of the semiconductor memory device does not include a capacitor used for storing data, but stores data in a floating body of the transistor included in the unit cell.

FIG. 1 is a circuit diagram illustrating a cell array of a general semiconductor memory device that includes unit cells each configured as a floating body transistor without any capacitors.

As shown, each unit cell included in the cell array includes a floating body transistor without any capacitors. In the floating body transistor, a gate is connected to one of word lines WL0 to WL3, a source is connected to one of source lines SL0 to SL3, and a drain is connected to one of bit lines BL0 and BL1. Also, the cell array further includes a dummy word line formed between the unit cells.

FIG. 2 is a cross-sectional diagram illustrating the cell array of FIG. 1 formed over a semiconductor substrate.

As shown, the cell array is formed over a SOI substrate that includes a bottom silicon layer 201, a buried insulating film 202 and a top silicon layer 203. In the top silicon layer 203, a portion except for the silicon active region 210 is etched, and buried with a device isolation film 211. A first gate pattern that includes a first gate spacer 203 and a first gate electrode 204 is formed over the center of the silicon active region 210, a second gate pattern that include a second gate spacer 213 and a second gate electrodes 214 are located over the device isolation film 211. Herein, the first gate electrode 204 located over the silicon active region 210 corresponds to one of the word lines WL0 to WL3 shown in FIG. 1, and the second gate electrode 214 positioned over the device isolation film 211 corresponds to the dummy word line WL shown in FIG. 1.

A contact plug 205 is formed at both sides of the gate pattern located over the silicon active region 210. One side is connected to a bit line 209 through a bit line contact 208, and the other side is connected to a source line 207 through a source line contact 206. The bit line 209 and the source line 207 are formed at a different level and at an intersection with each other.

FIGS. 3 to 6c are diagrams illustrating the cell array shown in FIG. 2.

Referring to FIG. 3, the island-shaped silicon active regions 210 are arranged over the SOI substrate in row and column directions. The neighboring silicon active regions 210 arranged in the row direction share the first gate electrode 204 as the word line WL. Between the neighboring silicon active regions 210 arranged in the column direction, the second gate electrode 214 over the device isolation film is formed as the dummy word line WL.

Referring to FIG. 4a, a contact plug mask 224 covers a space between the neighboring silicon active regions 210 arranged in the row direction to form a contact plug. A conductive material is deposited over the silicon active region 210 exposed between the first and second gate electrodes 204 and 214. Referring to FIG. 4b, formations of the gate electrode 204 and the contact plug 205 over the silicon active region 210 are understandable to people skilled in the art.

As shown in FIG. 5a, the conductive material deposited over the silicon active region 210 remains as the contact plug 205. A source line contact 206 is formed over one of the two contact plugs 205 located over the silicon active region 210. Referring to FIG. 5b, the source line contact 206 is formed over one of the two contact plugs 205.

Referring to FIG. 6a, the bit line contact 208 is formed over the other of the two contact plugs 205. A source line is formed over the source line contact 206 in a word line (WL) direction. The bit line 209 is formed in the column direction of the silicon active region 210. Particularly, FIG. 6b shows when the source line 206 is formed over the source line contact 206, and FIG. 6c shows when the bit line contact 208 is formed over the contact plug 205.

In the case of the unit cell including the above-described floating body transistor, holes remain in the floating body out of hot carriers generated corresponding to positive voltages ($V_G>0$, $V_D>0$) through the word line and a ground voltage GND (0V) applied to the source. While the semiconductor memory device performs a read operation for outputting data stored in the unit cells, a voltage is first supplied to the word line to turn on a cell transistor and, then, whether holes remain in the floating body, i.e., which the datum stored in the floating body is "0" or "1", is understood based on the amount and speed of current flowing from the source line to the bit line.

In the case of the unit cell of the above-described cell array, one of source/drain of the floating body transistor is connected to the source line 207 through the contact plug 205 and the source line contact 206. If a junction resistance between the source line 207 and the source line contact 206 or between the source line contact 206 and the one of source/drain is large, the amount and speed of current flowing through a channel of the floating body transistor can be determined based on the junction resistance rather than the amount of holes stored in the floating body. In this case, it is difficult to distinguish data values "0" from "1" stored in the floating body transistor, thereby degrading the operation of the semiconductor memory device.

BRIEF SUMMARY OF THE INVENTION

FIG. 1 is a circuit diagram illustrating a cell array of a general semiconductor memory device that includes unit cells each configured as a floating body transistor without any capacitors.

FIG. 2 is a cross-sectional diagram illustrating the cell array of FIG. 1 formed over a semiconductor substrate.

FIGS. 3 to 6c are diagrams illustrating the cell array shown in FIG. 2.

FIGS. 7a to 9c are diagrams illustrating a cell array including a unit cell configured as a floating body transistor in a semiconductor memory device according to an embodiment of the present invention.

BRIEF DESCRIPTION OF THE DRAWINGS

Various embodiments of the present invention are directed to providing a semiconductor memory device including a cell structure and a cell region layout for reducing a junction resistance and increasing amount of current throughout the unit cell in order to improve data sensing margin during read/write operations.

According to an embodiment of the present invention, a semiconductor memory device comprises plural unit cells, each coupled to contacts formed in different shape at both sides of a word line in a cell array.

Figure 1:
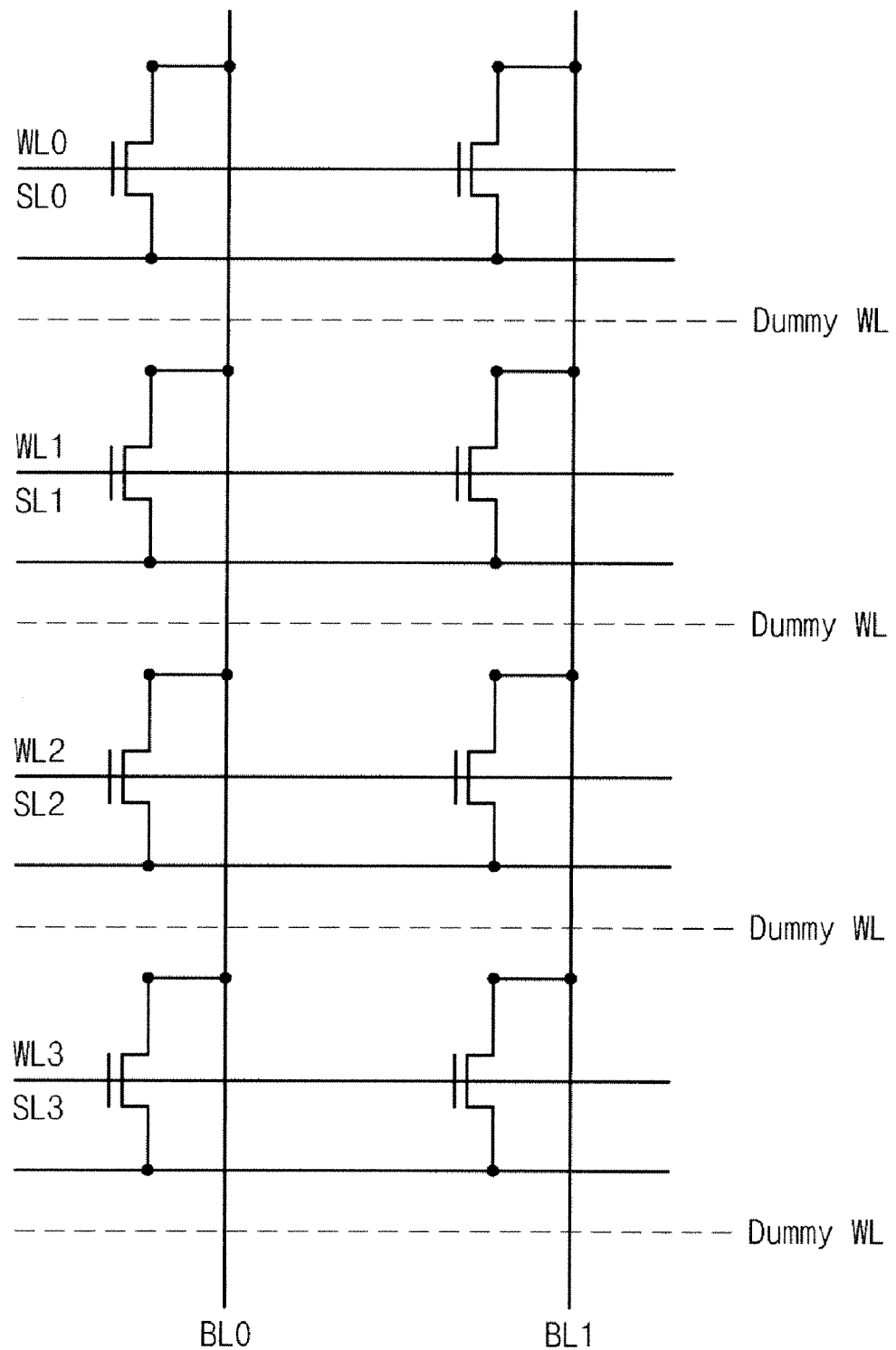
Figure 2:
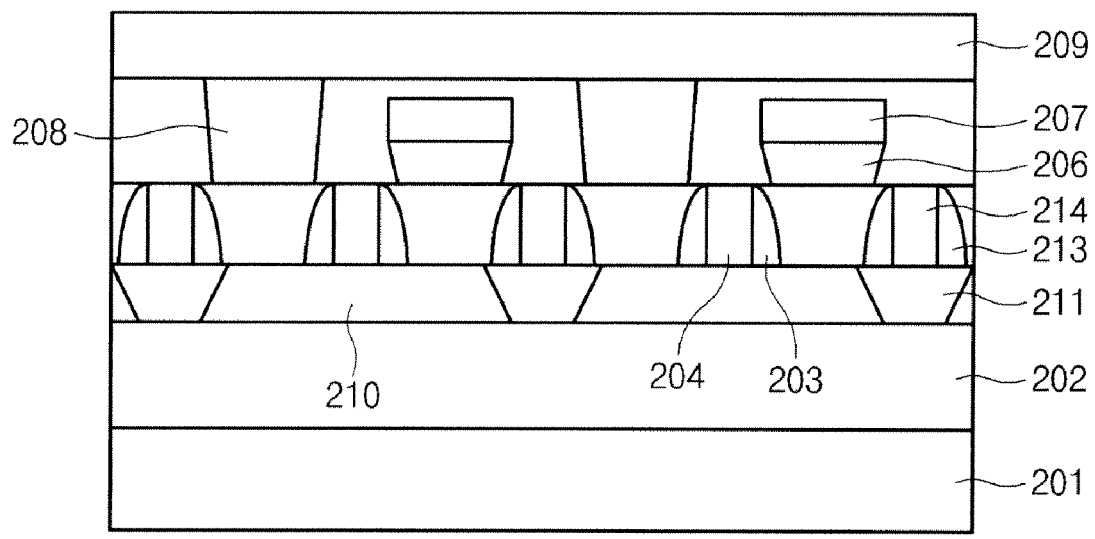
Figure 3:
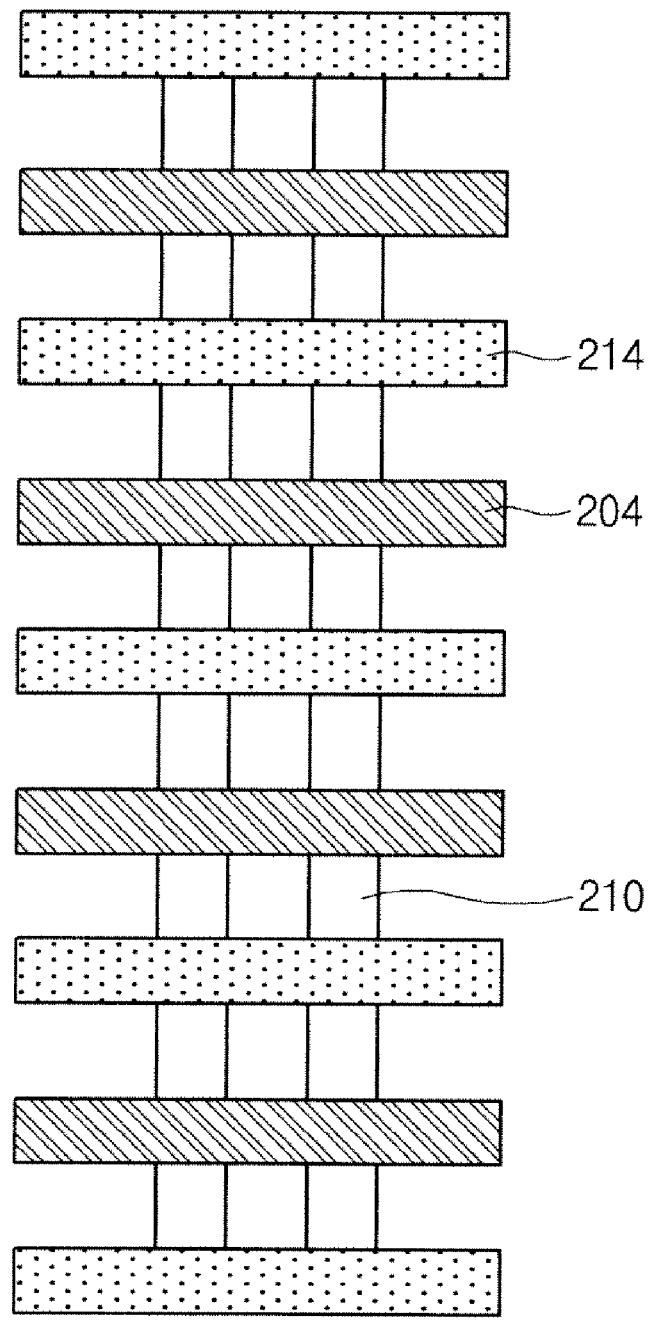
Figure 4A:
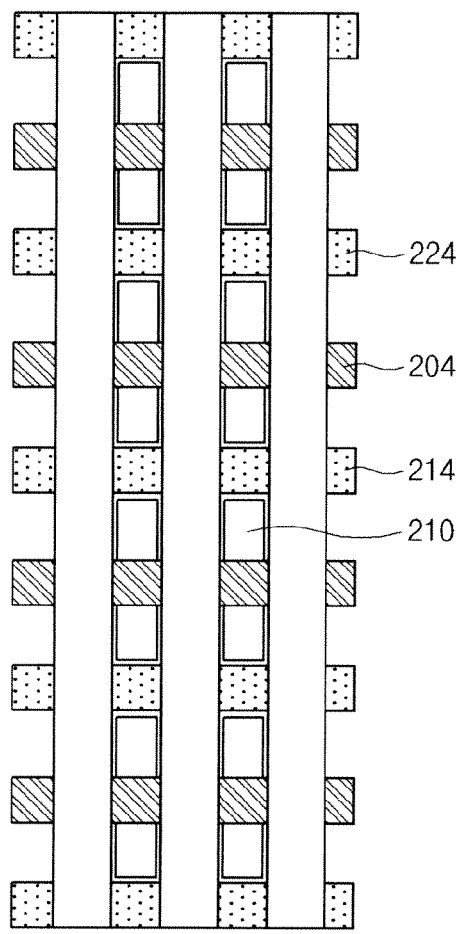
Figure 4B:
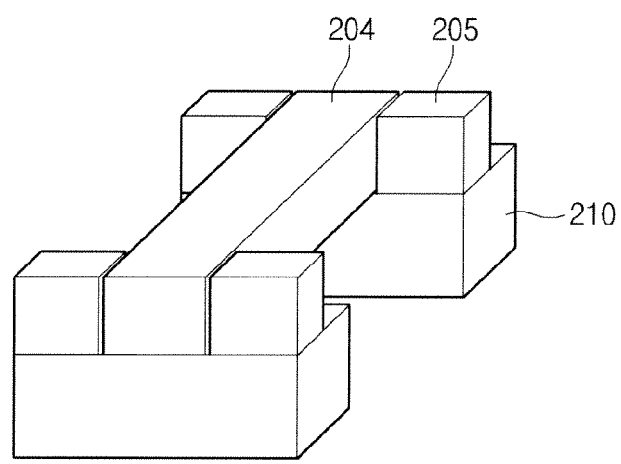
Figure 5A:
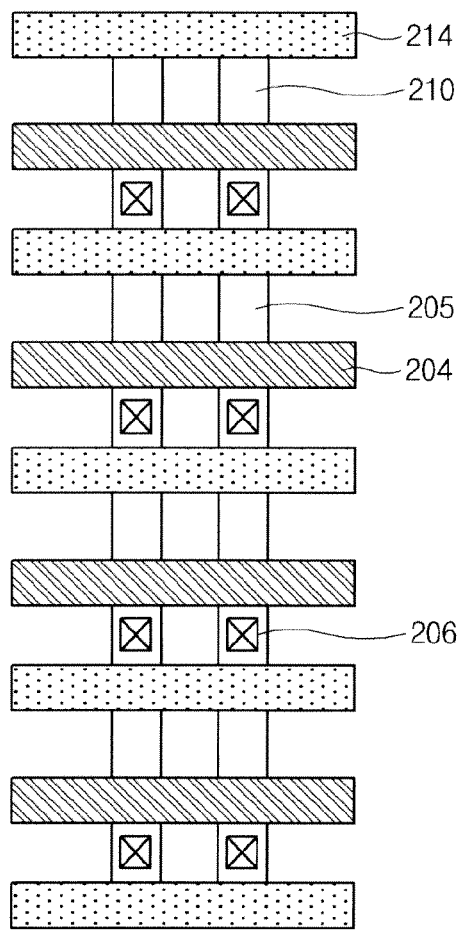
Figure 5B:
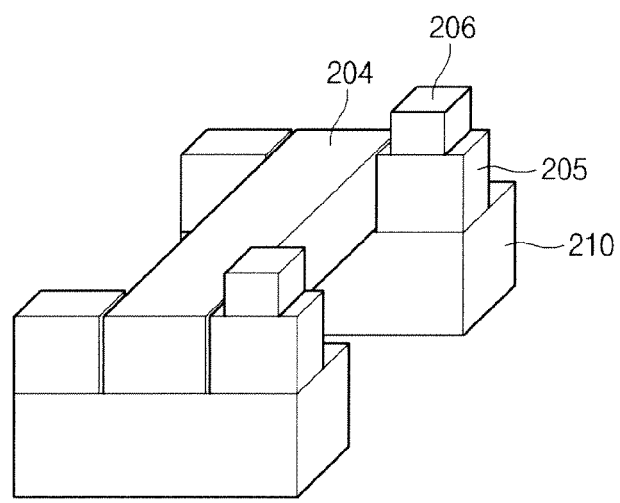

Preferably, the semiconductor memory device further comprises a bit line for transferring data to the unit cell and a source line for flowing amount of current into the unit cell during a read/write operation.

Preferably, the bit line is arranged in a cross-direction of the word line and the source line is arranged in a direction of the word line.

Preferably, the contacts include a first contact having an island shape for connecting one portion of an active region in the unit cell to the bit line and a second contact having a line shape for connecting the other portion of the active region to the source line.

Preferably, the unit cells aligned in a direction of the word line hold the second contact in common.

Preferably, the first contact includes a first contact plug connected to the one portion at a level of the word line and a bit line contact for connecting the first contact plug to the bit line.

Preferably, the second contact includes a second contact plug connected to the other portion at a level of the word line and a source line contact for connecting the second contact plug to the source line.

Preferably, each unit cell separated from neighboring unit cell by an isolation layer includes a floating body transistor having a gate used as the word line and source/drain formed in an active region.

Preferably, the number of unit cells included in single active region is 1 to 2.

Preferably, the cell array further includes a dummy word line formed on the isolation layer.

According to another embodiment of the present invention, a method for manufacturing a semiconductor memory device comprises forming contacts having different shape at both sides of word lines included in a cell array, wherein the contacts are formed in every unit cell.

Preferably, the method further comprises forming the word lines crossed over plural active regions included in the cell array, wherein every one or two word lines is formed over single active region and performing ion-implantation to form source/drain in each of the plural active regions.

Preferably, the forming-contacts-having-different-shape includes forming a first contact having an island shape on the drain of the active region and forming a second contact having a line shape on the source of the active region.

Preferably, the unit cells aligned in a direction of the word line hold the second contact in common.

Preferably, the method further comprises forming a bit line on the first contact, wherein the bit line is arranged in a cross-direction of the word line and forming a source line on the second contact, wherein the source line is arranged in a direction of the word line.

DESCRIPTION OF EMBODIMENTS

A semiconductor memory device comprising a cell array that includes a unit cell including a floating body transistor is configured to reduce a resistance between a source line and one side of source/drain of the floating body transistor so that more current may flow in the floating body transistor to guarantee a stable operation. Hereinafter, the present invention will be described in more detail with reference to the accompanying drawings.

FIGS. 7a to 9c are diagrams illustrating a cell array including a unit cell configured as a floating body transistor in a semiconductor memory device according to an embodiment of the present invention.

Figure 7A:
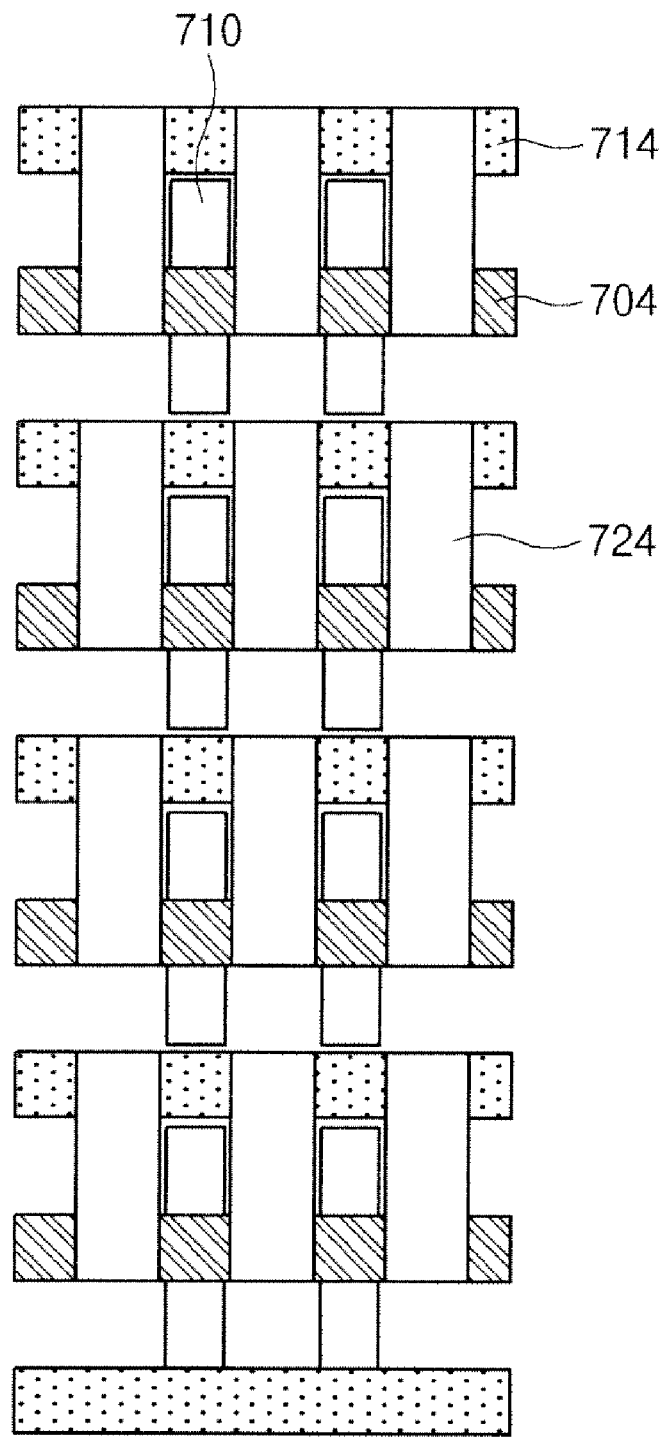

Referring to FIG. 7a, an island-shaped silicon active regions 710 are arranged over the SOI substrate in row and column directions. The neighboring silicon active regions 710 arranged in the row direction share the first gate electrode 704 as the word line WL. Between the neighboring silicon active regions 710 arranged in the column direction, the second gate electrode 714 over the device isolation film is formed as the dummy word line WL.

Contact plug masks 724 are arranged to form a contact plug. Referring to 4a, the conventional contact plug mask 224 has an aligned line pattern between the neighboring active regions. The contact plug mask 224 exposes the top portion of the active region with the word line 704 and the dummy word line 714. The island-shaped contact plug 205 is formed in the exposed region. Unlike the conventional art, the contact plug mask 724 is formed to have not a line shape but an island shape. The contact plug mask 724 does not cover all spaces between the neighboring active regions but covers a portion from the dummy word line to the word line. As a result, a region where a source line is formed at one side of the word line can be exposed.

Figure 7B:
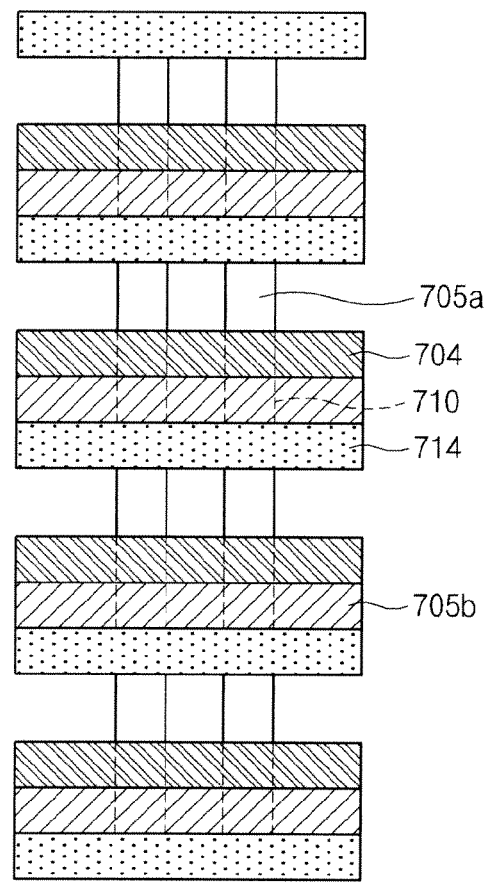
Figure 7C:
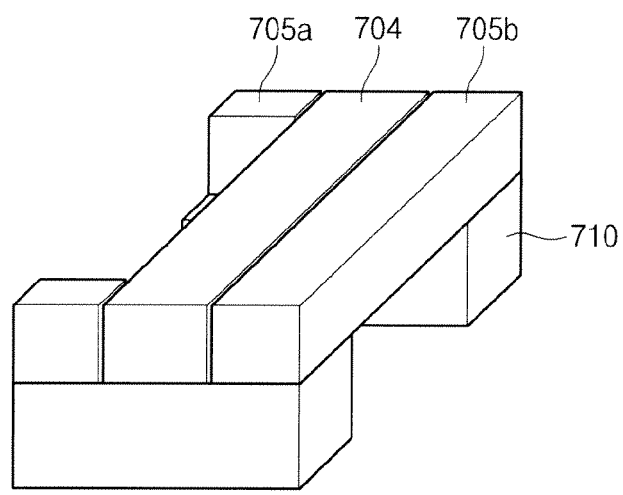

Referring to FIG. 7b, a first contact plug 705a and a second contact plug 705b are formed in the exposed region by the contact plug mask 724, the word line 704 and the dummy word line 714. The first contact plug 705a is formed over the active region positioned at one side of the word line so as to have an island shape. The second contact plug 705b is configured to have a line shape that can be shared by neighboring unit cells in the word line direction. Referring to FIG. 7c, the second contact plug 705b arranged in the same direction of the word line 704 is shown. Since FIG. 7c is a conceptual diagram illustrating a three-dimensional structure of the unit cell, operational components included in the semiconductor memory device are mainly explained, and an insulating film, a spacer, a device isolation film are omitted herein.

Figure 8A:
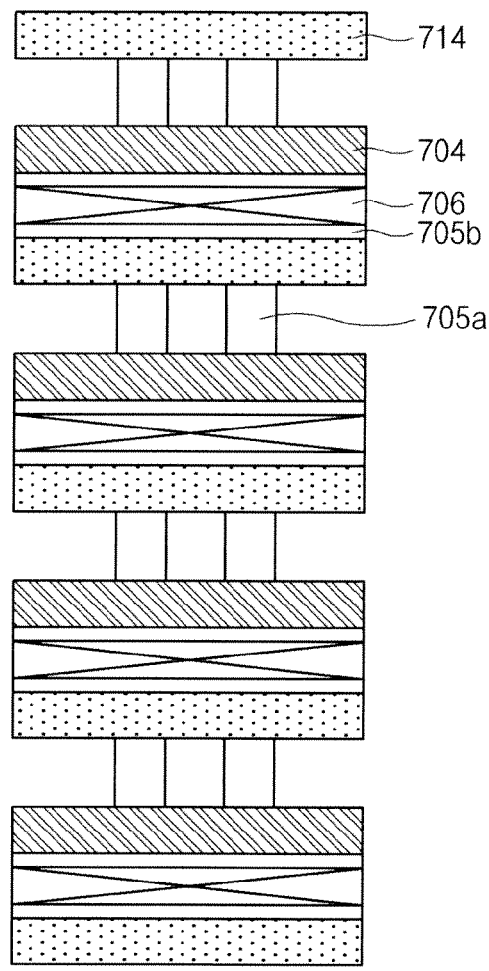
Figure 8B:
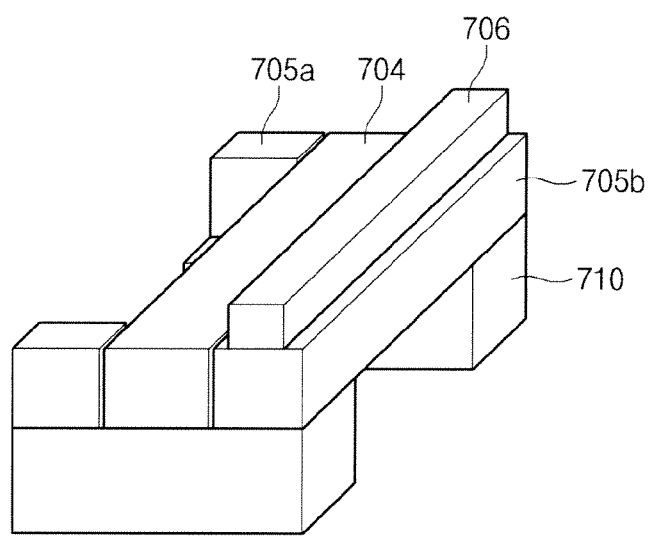

Referring to FIG. 8a, a source line contact 706 is formed over the second contact plug 705b. The source line contact 706 has a line shape that can be shared by the neighboring unit cells. Referring to FIGS. 8a and 8b, the source line contact 706 is horizontally placed between the word line 704 and the dummy word line 714, and vertically positioned over the second contact plug 705b.

Figure 9A:
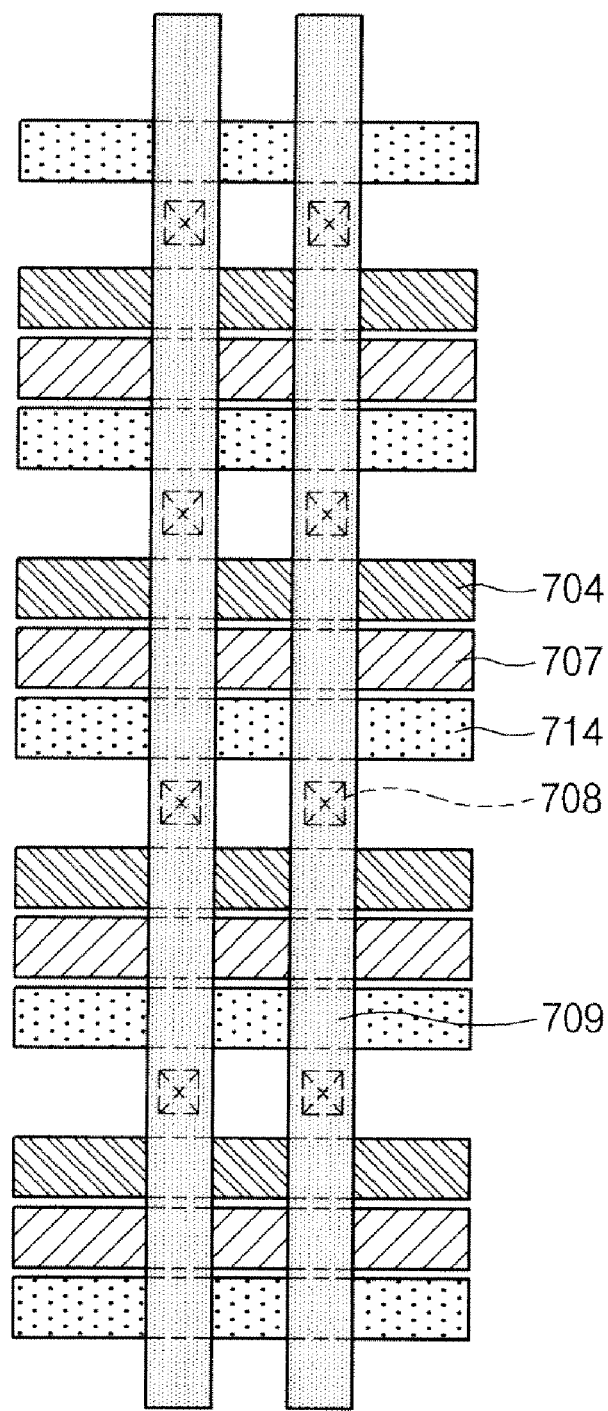

Referring to FIG. 9a, a source line 707 is formed over the source line contact 706, and a bit line contact 708 is formed over the first contact plug 705a. A bit line 709 is formed over the bit line contact 708 at an intersection with the word line 704.

Figure 9B:
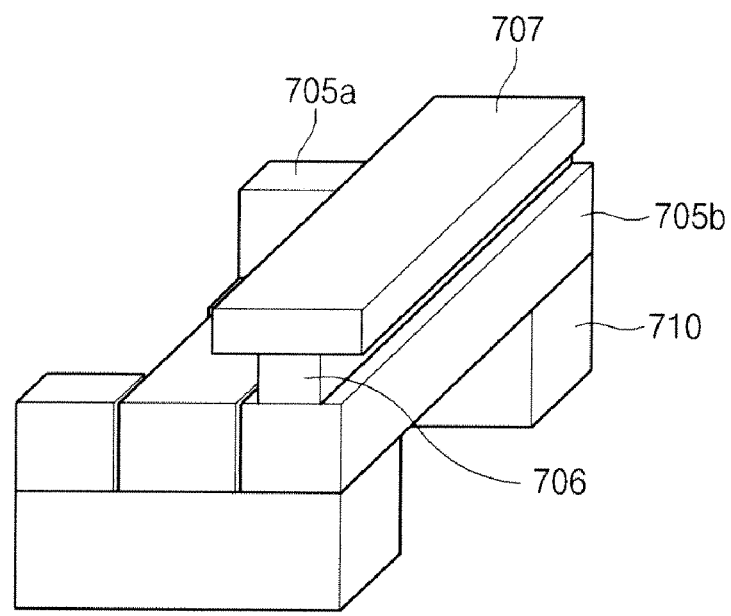

Referring to FIG. 9b, the source line 707 is placed over the source line contact 706. Unlike the conventional art, a plurality of unit cells that share the source line 707 can share the line-shaped source line contact 706a and the second contact plug 705b. As a result, the junction resistance between the source line 707 and the source line contact 706 and between the source line contact 706 and the second contact plug 705b can be reduced. As the junction resistance is reduced, the amount of current supplied to each unit cell is increased and, then, variations of amount and speed of current flowed depending on the amount of holes stored in the floating body becomes wider, thereby increasing a data sensing margin.

Figure 6A:
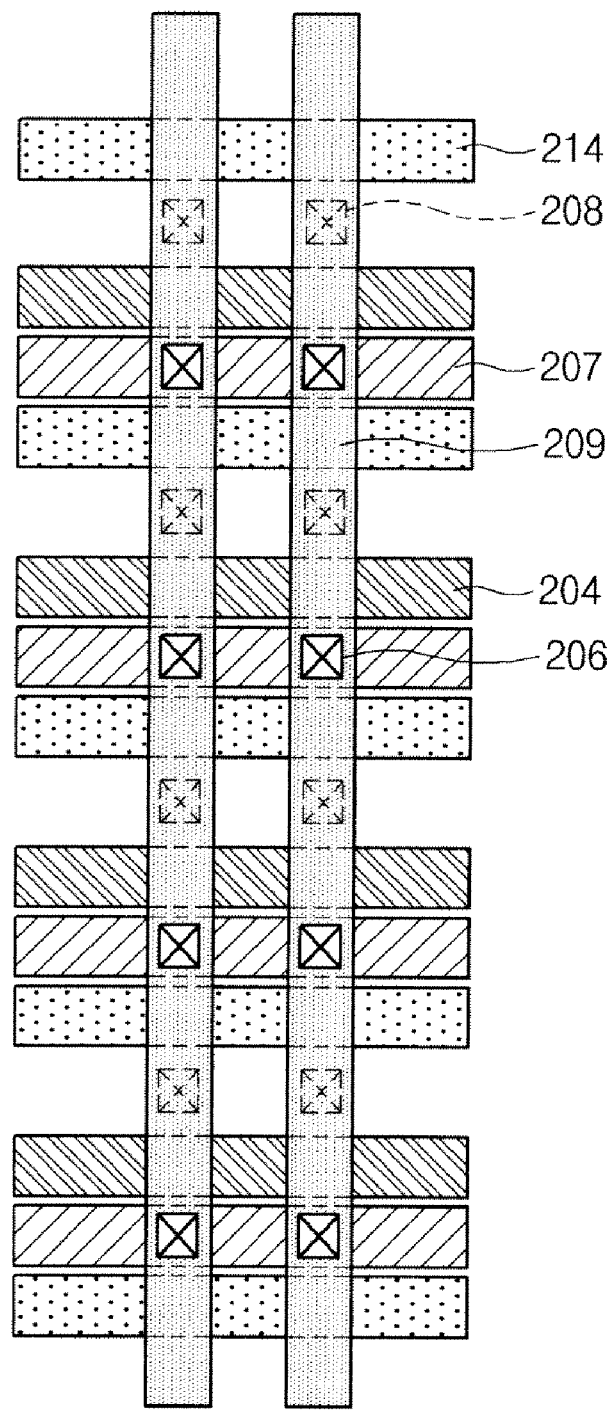
Figure 6B:
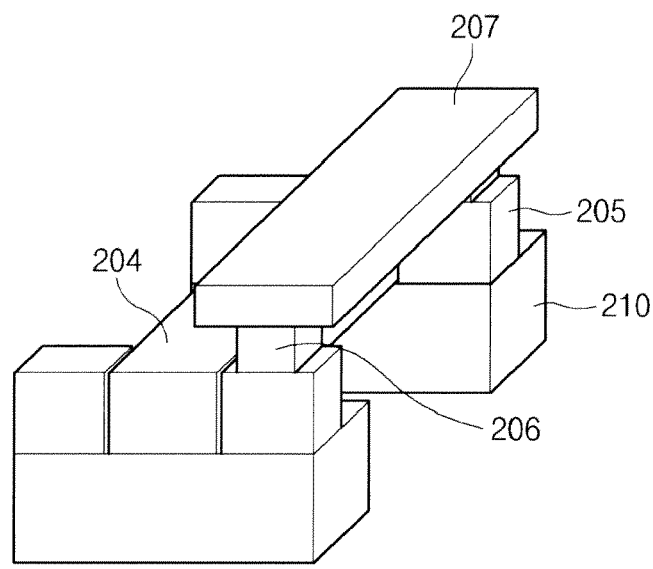
Figure 6C:
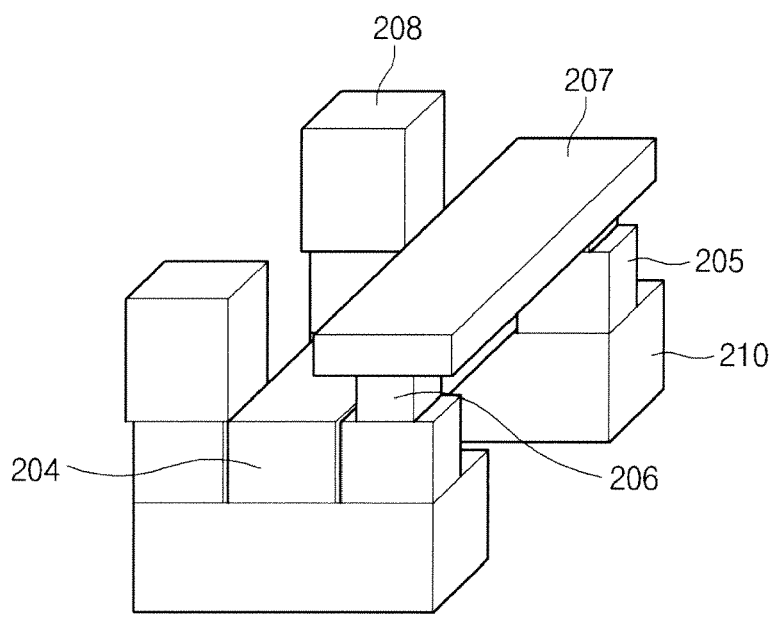
Figure 9C:
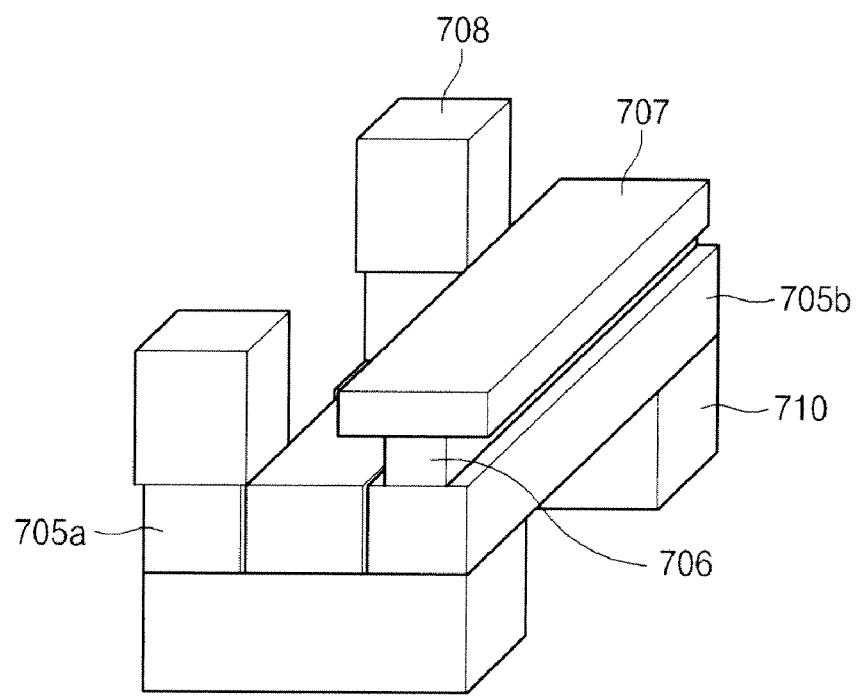

FIG. 9c shows the bit line contact 708 located over the first contact plug 705a. The island-shaped bit line contact 708 is formed to be higher than the source line 707 for connection with the bit line 709. The bit line contact 708 is substantially similar to the conventional bit line contact 208 shown in FIG. 6c.

As described above, the disclosed method for manufacturing a semiconductor memory device comprises forming a word line at an intersection with an active region in a cell array, and forming a different shaped contact plug at both sides of a word line. Through this method, the semiconductor memory device includes a different shaped contact plug at both sides of the word line of the cell array. Particularly, contact plugs include the first island-shaped contact plug 705a placed over the active region 710 positioned at one side of the word line 704, and the second line-shaped contact plug 705b shared by the neighboring unit cells located at the other side of the word line 704. Each unit cell includes a floating body transistor that has a gate used as the word line 704 and source/drain formed in the active region 710. The unit cell is isolated from the neighboring unit cell through a device isolation film. Also, one unit cell is formed in one active region 710, and the dummy word line 714 is positioned over the device isolation film in the same direction of the word line 704.

Herein, the first and the second contact plugs 705a and 705b are a kind of conductive patterns. There are various methods for forming any conductive pattern in a semiconductor device. For example, a method for forming a conductive pattern includes detailed processes: depositing an insulating layer over a semiconductor substrate; etching a partial portion of the insulating layer; and then filling a conductive material into an etched portion. Accordingly, contrary to a conventional art having an island-type contact plug, a pattern shape included in a mask for defining the first and second contact plugs 705a and 705b during the etching step is changed into a line-type. In the present invention, detailed processes for forming the first and the second contact plugs 705a and 705b are omitted in figures because those is well known to people skilled in the art.

In a semiconductor memory device according to an embodiment of the present invention, a contact plug and a source line contact for connecting an active region of the unit cell to a source line is formed as a line-type pattern which is hold in common by neighboring unit cells so that a junction resistance between the unit cell and the source line decreases. As a result, more amount of current can flow through the unit cell accessed during a read/write operation than a conventional semiconductor memory device, and a data sensing margin of the semiconductor memory device is increased.

The above embodiments of the present invention are illustrative and not limitative. Various alternatives and equivalents are possible. The invention is not limited by the type of deposition, etching polishing, and patterning steps describe herein. Nor is the invention limited to any specific type of semiconductor device. For example, the present invention may be implemented in a dynamic random access memory (DRAM) device or non-volatile memory device. Other additions, subtractions, or modifications are obvious in view of the present disclosure and are intended to fall within the scope of the appended claims.

What is claimed is:

1. A semiconductor memory device, comprising plural unit cells, each coupled to a first contact having an island shape for connecting one portion of an active region in the unit cell to the bit line and a second contact having a line shape for connecting the other portion of the active region to the source line at both sides of a word line in a cell array.

2. The semiconductor memory device according to claim 1, further comprising:
   a bit line for transferring data to the unit cell; and
   a source line for flowing amount of current into the unit cell during a read/write operation.

3. The semiconductor memory device according to claim 2, wherein the bit line is arranged in a cross-direction of the word line and the source line is arranged in a direction of the word line.

4. The semiconductor memory device according to claim 1, wherein the plural unit cells aligned in a direction of the word line hold the second contact in common.

5. The semiconductor memory device according to claim 1, wherein the first contact includes:
   a first contact plug connected to the one portion at a level of the word line; and
   a bit line contact for connecting the first contact plug to the bit line.

6. The semiconductor memory device according to claim 1, wherein the second contact includes:

a second contact plug connected to the other portion at a level of the word line; and a source line contact for connecting the second contact plug to the source line.

7. The semiconductor memory device according to claim 1, wherein each unit cell separated from neighboring unit cell by an isolation layer includes a floating body transistor having a gate used as the word line and source/drain formed in an active region.

8. The semiconductor memory device according to claim 7, wherein the number of unit cells included in single active region is 1 to 2.

9. The semiconductor memory device according to claim 7, wherein the cell array further includes a dummy word line formed on the isolation layer.

* * * * *